United States Patent [19]

Kubo et al.

[11] Patent Number: 5,442,182
[45] Date of Patent: Aug. 15, 1995

[54] ELECTRON LENS

[75] Inventors: Toshiro Kubo; Toshiyuki Ohashi, both of Katsuta; Mikio Ichihashi, Kodaira; Yuji Sato, Katsuta, all of Japan

[73] Assignee: Hitachi, Ltd., Tokyo, Japan

[21] Appl. No.: 145,161

[22] Filed: Nov. 3, 1993

[30] Foreign Application Priority Data

Nov. 6, 1992 [JP] Japan .................. 4-321483

[51] Int. Cl.$^6$ .......................................... H01J 37/141
[52] U.S. Cl. ................ 250/396 ML; 250/311; 250/398
[58] Field of Search .......... 250/396 R, 396 ML, 398, 250/311

[56] References Cited

U.S. PATENT DOCUMENTS

| | | | |
|---|---|---|---|
| 2,323,328 | 7/1943 | Hiller | 250/396 ML |
| 2,418,349 | 4/1947 | Hiller et al. | 250/396 ML |
| 3,683,200 | 8/1972 | Francken | 307/113 |
| 3,851,172 | 11/1974 | Gzasa et al. | 250/396 ML |
| 4,345,152 | 8/1982 | Gerlach | 250/396 ML |
| 4,544,847 | 10/1985 | Taylor | 250/396 ML |

Primary Examiner—Bruce C. Anderson
Attorney, Agent, or Firm—Antonelli, Terry, Stout & Kraus

[57] ABSTRACT

An electron lens comprising a first exciting coil, a second exciting coil, a casing for encompassing the first and second exciting coils, and an excitation control apparatus for controlling the excitation state of at least the first exciting coil independently of the second exciting coil. The excitation control apparatus independently controls currents applied to the first and second exciting coils, respectively. At this time, exothermy of each coil can be kept constant and thermal deformation of the casing can be prevented by keeping the sum of the absolute values of the currents applied to the coils.

29 Claims, 4 Drawing Sheets

ELECTRON LENS

BACKGROUND OF THE INVENTION

This invention relates generally to an electron lens. More particularly, it relates to a magnetic field type electron lens. This electron lens is used for converging or expanding charged particle beams in an electron microscope, an electron beam apparatus (EB), an ion beam apparatus, and so forth.

The magnetic field type electron lens in general converge or expand an electron beam by causing currents to flow through exciting coils disposed inside a magnetic path to generate magnetic fields.

When an electron lens having a high intensity is necessary, the currents to be caused to flow through the exciting coils are increased, or the number of turns of the exciting coils is increased. To increase the exciting currents, however, a power supply having the capacity of supplying greater currents is necessary. When the number of turns of the exciting currents is increased, a high voltage must be generated because the resistance of the exciting coils increases.

To solve these problems, JP-A-3-20950, for example, discloses a technology which disposes a plurality of exciting coils inside the same magnetic path, connects these coils in parallel with one another, and causes current to flow through them so as to resistrict the rise of a power supply voltage, and the increase of the current capacity while increasing the number of turns of the exciting coils and lowering their resistance.

In the prior art technology described above, however, when the currents passed through the exciting coils are changed so as to change the intensity of the electron lens, power that is consumed by the coils is proportional to the square of the exciting current unless the resistance of the exciting coils changes. In other words, when the exciting current is increased to increase the intensity of the electron lens, the magnetic path or in other words, a casing of the coil, undergoes thermal deformation due to the heat generated in accordance with this power. This deformation adversely affects the intensity and distribution with respect to the magnetic field of the electron lens and invites problems such as an irregular drift of an electron beam.

The prior art related with the present invention is disclosed in U.S. Pat. No. 4,306,149.

SUMMARY OF THE INVENTION

It is an object of the present invention to provide an electron lens having a novel construction.

It is another object of the present invention to provide a technology of changing the intensity of an electron lens without changing at all the temperature of a magnetic path or in other words, without inviting at all deformation of the magnetic path.

An electron lens according to one embodiment of the present invention has a construction wherein two exciting coils are accommodated in a hollow doughnut-shaped casing, that is, in a magnetic path. Each of these coils has the same number of turns of winding and the same turning direction, and is put one upon another in a vertical direction in such a manner that the center axis thereof substantially coincides with that of the other. According to such an arrangement, the magnetic fields generated by these coils superpose with each other, and generate the same magnetic field, that is, a lens intensity, with respect to the impressed voltage. In other words, the magnetic field generated when a first current is applied to only a first coil is substantially equal to the magnetic field generated when the first current is applied to only a second coil. When the first current is applied to the first coil while a second current having an equal absolute value to that of the first current but having an opposite polarity is applied to the second coil, the magnetic fields generated by the two coils offset each other.

Assuming that the turning directions of the windings of the first and second coils are opposite to each other, then, the magnetic fields generated by these coils offset each other when the first current is applied to both of the first and second coils. In this case, if the first current is applied to the first coil and a second coil having an equal absolute value to that of the first current but having an opposite polarity is applied to the second coil, the intensity of the electron lens is expressed by the sum of the magnetic fields generated by these coils.

The first embodiment of the present invention demonstrates an example of the electron lens in which the absolute values of the currents applied to the first and second coils are linearly changed. The current applied to each coil is independently controlled. However, to keep exothermy of each coil constant, the sum of the absolute values of the currents applied to the coils is kept constant. The current applied to at least one of the coils can be changed linearly and admit to take an opposite polarity beyond zero (0).

Another embodiment uses three exciting coils. The present invention uses at least two exciting coils.

A plurality of coils having different numbers of turns can also be employed. In such a case, too, the intensity of the electron lens can be changed by keeping constant the sum of the absolute values of the currents to be applied to the coils, and thus keeping constant the temperature of the magnetic path and restricting deformation of the magnetic path.

DESCRIPTION OF THE PREFERRED EMBODIMENTS

Hereinafter, preferred embodiments of the present invention will be described in detail with reference to the accompanying drawings.

Figure 1:
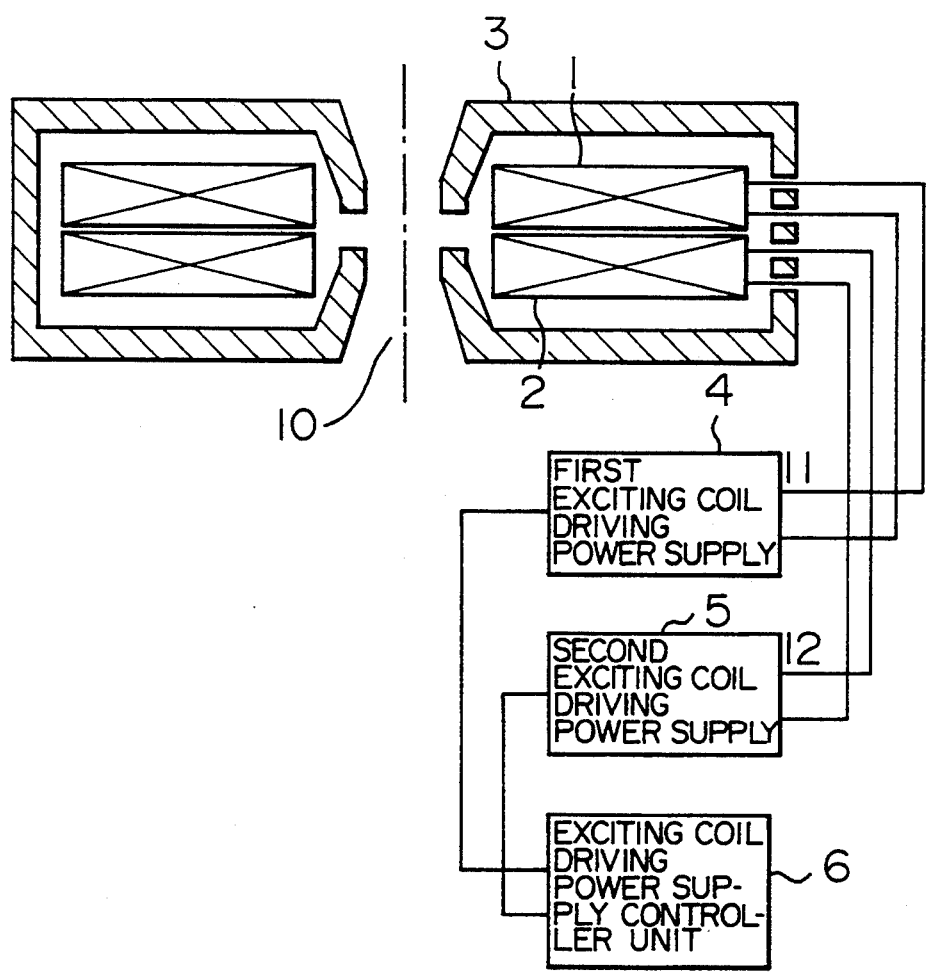
FIG. 1 is a sectional view showing the construction of a magnetic field type electron lens according to an embodiment of the present invention.

FIG. 1 is a structural view of a magnetic field type electron lens according to an embodiment of the present invention.

In FIG. 1, a first exciting coil 1 and a second exciting coil 2 are shown would in the same turning direction with a charged particle beam path 10 being a center axis inside a yoke (magnetic path) 3 for an electron lens. The first exciting coil 1 is electrically connected to a first exciting coil driving power supply 4 while the second exciting coil 2 is electrically connected to a second exciting coil driving power supply 5.

Whereas a current polarity of the first exciting coil driving power supply 4 is constant, the second exciting coil driving power supply 5 is of a bipolar type the current polarity of which can be changed over. The exciting currents I1 and I2 supplied from the first and second exciting coil driving power supplies 4, 5 to the first and second exciting coils 1, 2 are controlled by an exciting coil driving power supply controller unit 6.

Figure 2:
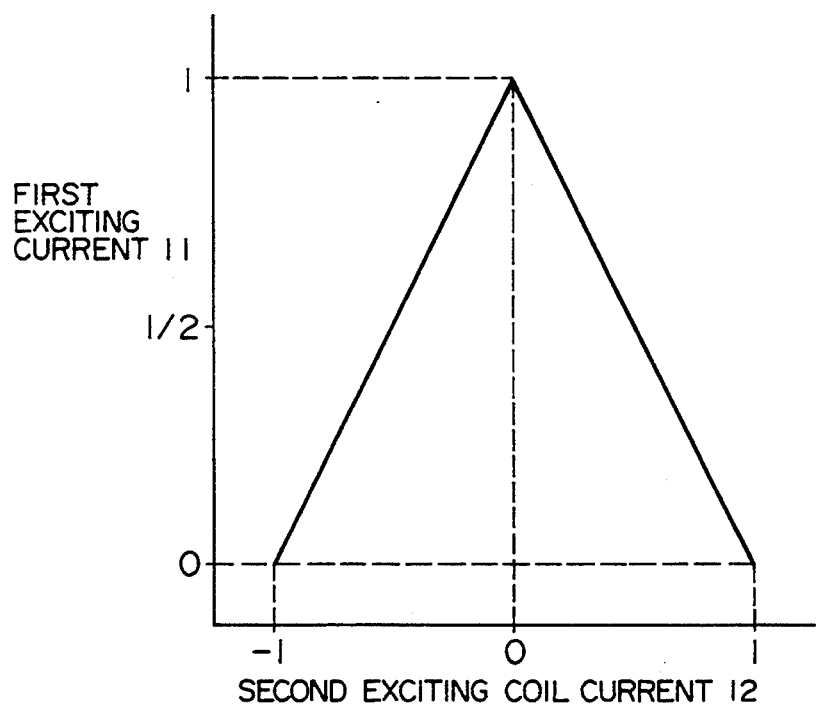
FIG. 2 is a graph showing the relationship between a first exciting current and a second exciting current each being applied to an exciting coil of the electron lens shown in FIG. 1.

This controller unit 6 controls the exciting currents I1 and I2 in such a fashion that the sum of their absolute values becomes substantially constant. FIG. 2 shows the relationship between these currents I1 and I2 in which the currents I2 is standardized by their maximum intensity.

Figure 3:
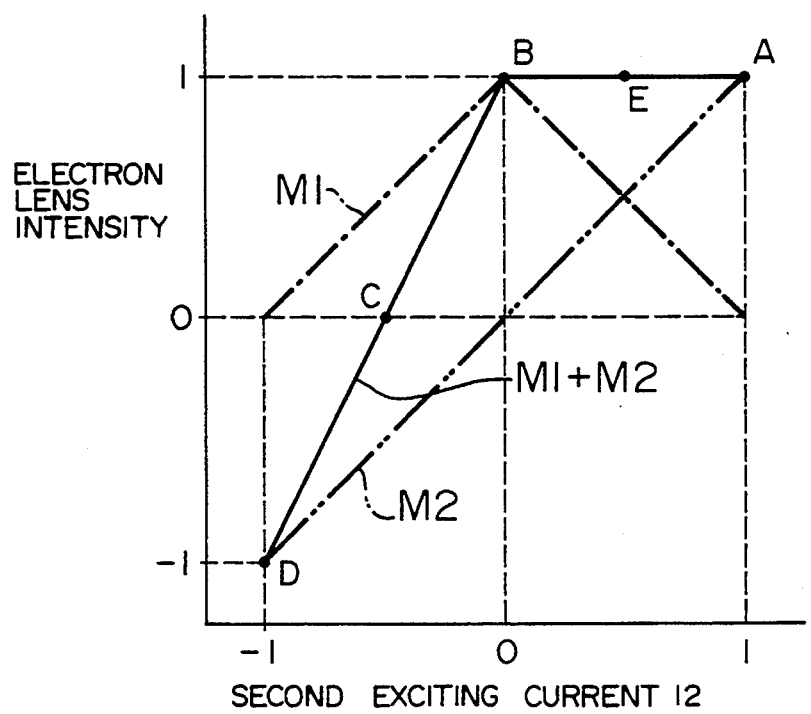
FIG. 3 is a graph showing the relationship between the second exciting current and an electron lens intensity.

FIG. 3 shows the effective intensity of an electron lens by means of superimposition of the currents I1 and I2 versus the current I2. A one-dot-chain line M1 represents a first electron lens intensity which is generated only by the first exciting coil 2 with the current I1. A two-dot chain line M2 represents a second electron lens intensity which is generated only by the second exciting coil 2 with the current I2. A solid line represents the effective intensity of the electron lens, that is, it shows the sum of the first and second intensity of the two coils 1 and 2.

The characteristics of the electron lens is as follows. At a portion A-B of the solid line, at which the electron lens intensity is constant, the currents I1 and I2 applied to the respective coils 1 and 2 have the same polarity.

On the other hand, at a portion B-C-D on the solid line, the currents I1 and I2 have the opposite polarity to each other. The electron lens intensity changes on proportion to the ratio of the currents I1 and I2. Negative lens intensity in FIG. 3 means that the rotating direction of an image becomes opposite. This phenomenon is appeared at the same time of the lens' focusing operation. As described above, when a pair of coils are disposed in the single magnetic path and the direction of the current to be passed through each of the coils is reversed, the intensity of the electron lens can be changed from zero to the maximum value (+1) while the sum of the absolute values of the currents flowing through the same magnetic path is kept constant.

Points C and E in FIG. 3 represent significant operational points of the lens of the present embodiment. At these points, the currents I1 and I2 have the same absolute value. At the point C, the currents have opposite polarity to each other so that the magnetic fields generated by the two exciting coils 1 and 2 offset each other, and lens intensity becomes zero when the intensity of the electron lens is considered as a whole. On the contrary, at the point E, the magnetic field generated by the two coils are superimposed to each other so that the lens action, which is two times stronger than the single coil, can be obtained.

Figure 4:
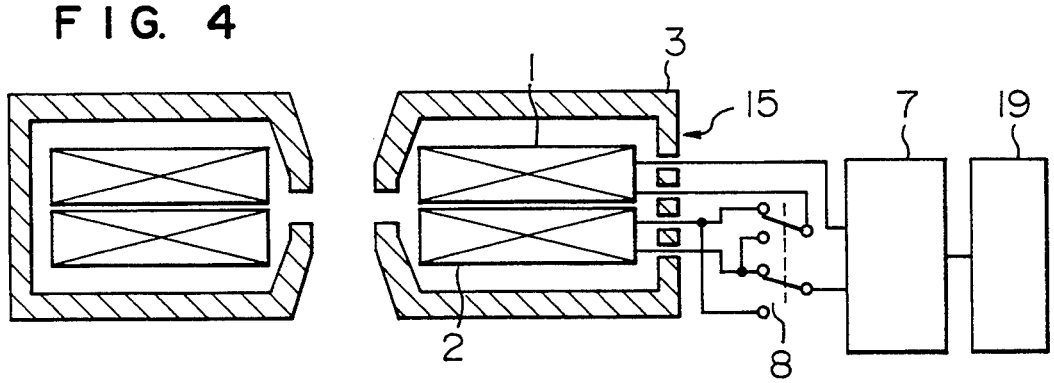
FIG. 4 is a sectional view showing the construction of a magnetic field type electron lens according to another embodiment of the present invention.

FIG. 4 shows a second embodiment of the present invention. When a common exciting coil driving power supply 7 is used and the direction of the current I2 flowing through the second exciting coils 2 is switched by a polarity switch apparatus 8 as shown in the figure, the electron lens can easily be turned ON and OFF. In this case, the number of turns of the first and second exciting coils 1 and 2 is the same.

The above description is applied in the case where the exciting coils 1 and 2 have the same turning direction. A magnetic field of the lens depends on both the turning direction and the polarity of exciting current. Accordingly, when one of coils has the opposite turning direction, the polarity of the exciting current applied to the coil should be turned so as to adapt also the above description.

Figure 5A:
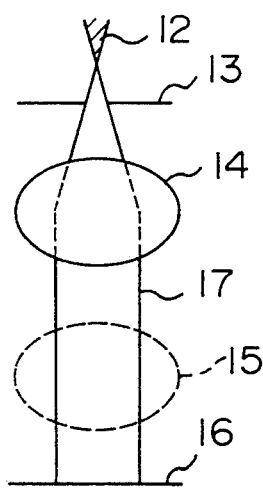
FIGS. 5A and 5B are explanatory views each useful for explaining the operation principle of an electron microscope to which the lens shown in FIG. 4 is applied.
Figure 5B:
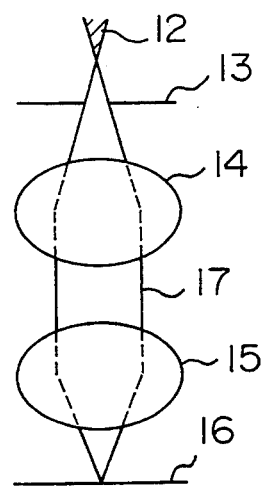

FIGS. 5A and 5B show an application example of the electron lens having the construction described above to a transmission electron microscope.

In the drawing, an angular aperture of the electron beam emitted from an electron source 12 is limited by an aperture stop 13, and the electron beam is then irradiated on a specimen 16 through first and second converging lenses 14 and 15.

Analysis of the specimen is carried out by the transmission electron microscope in the following way. First of all, the electron beam 17 is irradiated under the expanded state to the specimen 16 as shown in FIG. 5A to obtain a transmission image of this specimen. A portion (a very small portion) to be analyzed is determined in the image obtained in this way, and a thinly contracted electron beam is then irradiated to this portion (see FIG. 5B). Secondary data generated from this portion such as secondary electrons, X-rays, etc., are detected by a known detector, and useful data such as data of compositions, crystalline structures, etc., can be obtained.

In the construction shown in FIGS. 5A and 5B, the electron lenses 14 and 15 constitute a condenser group of the electron beam irradiation system. The electron lens of this embodiment shown in FIG. 4 is used as the electron lens 15. In other words, the OFF state of this electron lens 15 is shown in FIG. 5A and its ON state, in FIG. 5B.

As described above, the switch 8 makes the ON/OFF control of the electron lens 15. To prevent wear of the contacts of the switch 8 in this embodiment, the controller 19 controls the power supply 7 at the time of switching of the switch 8 and makes the currents applied to the coils 1 and 2 temporarily (approximately for a second) zero.

The coils 1 and 2 of the electron lens used in this embodiment have the number of turns of 560, and a current of 2.3 A is applied. The dimensions of the coils 1, 2 and the magnetic path 3 are substantially the same as those of an electron microscope (type HF-2000) produced by HITACHI, Ltd., the assigner of the present application.

Figure 6:
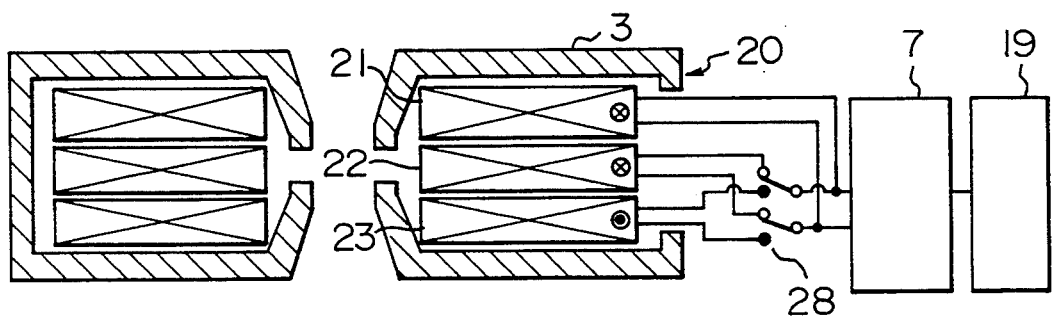
FIG. 6 is a sectional view showing the construction of a magnetic field type lens according to still another embodiment of the present invention.

FIG. 6 shows an electron lens 20 according to another embodiment of the present invention. Like reference numerals are used in this drawing to identify like constituents as in FIG. 4, and the repetition of explanation of such constituents will be omitted.

In the embodiment shown in FIG. 4, the first exciting coil 1 and the second exciting coil 2 are connected in series. In this embodiment, however, second and third exciting coils 22 and 23 are connected in parallel with the first exciting coil 21. These first to third exciting coils have the same number of turns. The turning direction of the first exciting coil is the same as that of the second exciting coil but is opposite to that of the third exciting coil. A switch 28 selectively connects one of the second and third exciting coils to the power supply 7. A current is always applied from the power supply 7 to the first exciting coil 21.

As is obvious from this drawing, when the switch 28 selects the exciting coil 22, the electron lens 20 is turned ON and the intensity of the electron lens is expressed by the sum of the magnetic fields generated by the first and second exciting coils. On the other hand, when the switch 28 selects the third exciting coil 23, the magnetic field generated by the first exciting coil 21 offsets the magnetic field generated by the third exciting coil 23, so that the electron lens 20 is turned OFF.

On the other hand, when a conventional electron lens is used, the current which excites the second converging lens 15 greatly fluctuates. Accordingly, the temperature change of the second converging lens 15 becomes so vigorous that stability of the electron lens 15 is lost and defocusing and a temperature drift take place.

In contrast, when the construction of the present invention is applied to the second converging lens 15, only the lens intensity can be changed (ON/OFF) while the exciting current of the second converging lens 15 is kept constant. Accordingly, the second converging lens 15 is now substantially free from the temperature drift and can exhibit stable performance.

Figure 7:
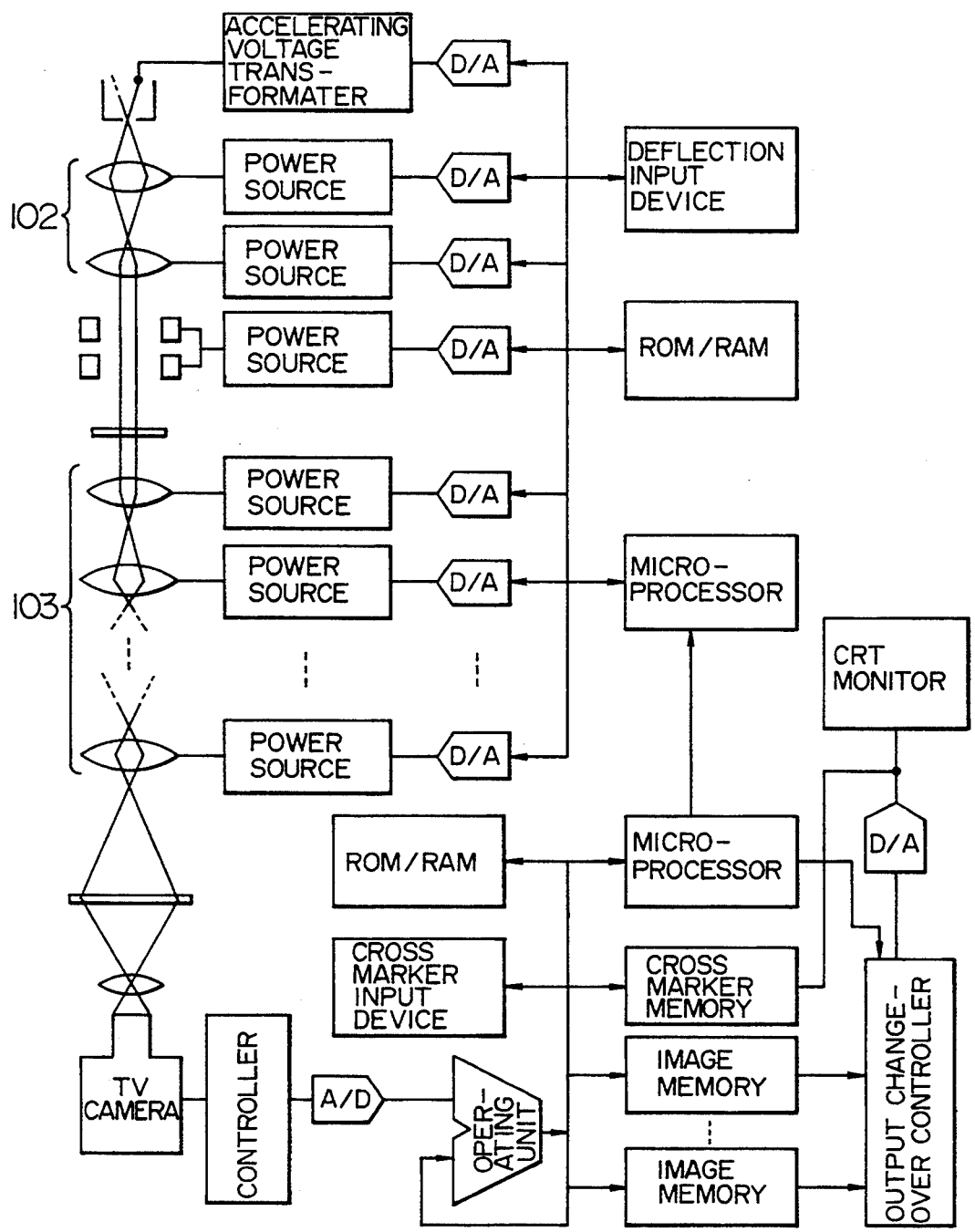
FIG. 7 is a structural view of a transmission electron microscope.

The electron lens disclosed in each of the foregoing embodiments can be used as the electron lens of an electron microscope having the construction shown in FIG. 7. Particularly, the electron lens is preferably used as a condenser lens 102 of the electron beam irradiation system or an image forming lens 103. As to the construction of the electron microscope shown in FIG. 7, refer to U.S. Pat. No. 4,788,425, which is incorporated herein by reference.

The electron lens disclosed in each of the foregoing embodiments can further be applied to the electron microscopes described in U.S. Pat. Nos. 4,945,237 and 5,144,129, both of which are incorporated herein by reference.

Needless to say, the electron lens of each of the foregoing embodiments can further be applied to an ion beam apparatus, an electron beam apparatus (EB), and so forth.

Although the present invention has thus been described with reference to some preferred forms thereof, it should be understood that various changes, substitutions and alterations can be made without departing from the spirit and scope of the invention as defined by the appended claims.

We claim:

1. An electron lens comprising:
   a first exciting coil;
   a second exciting coil;
   a casing for encompassing said first and second exciting coils, said casing having a magnetic path with a single gap therein; and
   excitation control means for controlling an excitation state of at least said first exciting coil independently from said second exciting coil.

2. An electron lens according to claim 1, wherein said excitation control means comprises:
   first and second power supplies for supplying currents to said first and second exciting coils, respectively, disposed outside said casing;
   power supply lines for connecting said power supplies to said first and second exciting coils, penetrating through said casing; and
   first control means for controlling a first quantity of the current supplied to at least said first exciting coil independently of a second quantity of the current supplied to said second exciting coil.

3. An electron lens according to claim 2, further comprising:
   second control means for keeping the sum of an absolute value of said first current quantity and an absolute value of said second current quantity substantially constant.

4. An electron lens according to claim 2, wherein said first exciting coil and said second exciting coil have the same number of turns and the same turning direction, and said first control means changes the absolute value and polarity of the current supplied to said first exciting coil but keeps constant the absolute value and polarity of the current supplied to said exciting current.

5. An electron lens according to claim 2, wherein said first exciting coil and said second exciting coil have the same number of turns but have different turning directions from each other, and said first control means changes the absolute value and polarity of the current supplied to said first exciting coil but keeps constant the absolute value and polarity of the current applied to said second exciting coil.

6. An electron lens according to claim 2, wherein said first exciting coil and said second exciting coil have the same number of turns and the same turning direction, and said first control means independently changes the absolute values and polarities of the currents supplied to said first and second exciting coils, respectively.

7. An electron lens according to claim 2, wherein said first exciting coil and said second exciting coil have the same number of turns but have different turning directions from each other, and said first control means independently changes the absolute values and polarities of the currents supplied to said first and second exciting coils, respectively.

8. An electron microscope comprising:
   an electron gun;
   a specimen table; and
   said electron lens as defined in claim 1.

9. An electron lens according to claim 8, wherein said electron lens is used as a condenser lens.

10. An electron microscope according to claim 8, wherein said first exciting coil and said second exciting coil have substantially the same number of turns, and said excitation control means selectively assumes a first state where said first and second exciting coils are excited in such a manner as to strengthen their magnetic fields, and a second state where said first and second exciting coils are excited in such a manner as to offset their magnetic fields.

11. An electron microscope according to claim 8, wherein said excitation control means comprises two terminals for each of said first and second exciting coils, a power supply and a switch, and wherein one of said terminals of said first exciting coil is connected to said power supply, the other of said terminals of said first exciting coil is connected selectively to one of said terminals of said second exciting coil by said switch, and said switch connects the other of said terminals of said second exciting coil to said power supply, so that when said switch is under a first state, said first and second exciting coils are excited in such a manner as to strengthen their magnetic fields, and when said which is under a second state, said first and second exciting coils are excited in such a manner as to substantially offset their magnetic fields.

12. An electron microscope according to claim 8, wherein said excitation control means comprises:
first and second power supplies for supplying currents to said first and second exciting coils, respectively, disposed outside said casing;
current supply lines for connecting said power supplies to said first and second exciting coils, respectively, penetrating through said casing; and
first control means for controlling at least a first quantity of the current supplied to said first exciting coil independently of a second quantity of the current supplied to said second exciting coil.

13. An electron microscope according to claim 8, wherein said electron lens is used as a projection lens.

14. An electron beam irradiation apparatus equipped with said electron lens as defined in claim 1.

15. An electron beam irradiation apparatus according to claim 14, wherein said electron lens is used as a condenser lens.

16. An electron beam irradiation apparatus according to claim 14, wherein said first exciting coil and said second exciting coil have substantially the same number of turns, and said excitation control means selectively assumes a first state wherein said first and second exciting coils are excited in such a manner as to strengthen their magnetic fields, and a second state where said first and second exciting coils are excited in such a manner as to substantially offset their magnetic fields.

17. An electron beam irradiation apparatus according to claim 14, wherein said excitation control means comprises two terminals for each of said first and second exciting coils, a power supply and a switch, and wherein one of said terminals of said first exciting coil is connected to said power supply, the other of said terminals of said first exciting coil is selectively connected to one of said terminals of said second exciting coil by said switch, and said switch connects the other of said terminals of said second exciting coil to said power supply, so that when said switch is under a first state, said first and second exciting coils are excited in such a manner as to strengthen their magnetic fields, and when said switch is under a second state, said first and second exciting coils are excited in such a manner as to substantially offset their magnetic fields.

18. An electron lens comprising:
a first exciting coil;
a second exciting coil;
a casing for encompassing said first and second exciting coils; and
excitation control means for controlling an excitation state of at least said first exciting coil independently from said second exciting coil;
wherein said excitation control means comprises:
first and second power supplies for supplying currents to said first and second exciting coils, respectively, disposed outside said casing;
power supply lines for connecting said power supplies to said first and second exciting coils, penetrating through said casing;
first control means for controlling a first quantity of the current supplied to at least said first exciting coil independently of a second quantity of the current supplied to said second exciting coil; and
second control means for keeping the sum of an absolute value of said first current quantity and an absolute value of said second current quantity substantially constant.

19. An electron lens according to claim 18, wherein said first exciting coil and said second exciting coil have the same number of turns and the same turning direction, and said first control means changes the absolute value and polarity of the current supplied to said first exciting coil but keeps constant the absolute value and polarity of the current supplied to said exciting current.

20. An electron lens according to claim 18, wherein said first exciting coil and said second exciting coil have the same number of turns but have different turning directions from each other, and said first control means changes the absolute value and polarity of the current supplied to said first exciting coil but keeps constant the absolute value and polarity of the current applied to said second exciting coil.

21. An electron lens according to claim 18, wherein said first exciting coil and said second exciting coil have the same number of turns and the same turning direction, and said first control means independently changes the absolute values and polarities of the currents supplied to said first and second exciting coils, respectively.

22. An electron lens according to claim 18, wherein said first exciting coil and said second exciting coil have the same number of turns but have different turning directions from each other, and said first control means independently changes the absolute values and polarities of the currents supplied to said first and second exciting coils; respectively.

23. An electron lens according to claim 18, wherein said first exciting coil and said second exciting coil have substantially the same number of turns, and said excitation control means comprises two terminals for each of said first and second exciting coils, a power supply and a switch, and wherein one of said terminals of said first exciting coil is connected to said power supply, the other of said terminals of said first exciting coil is selectively connected to one of said terminals of said second exciting coil by said switch, and said switch connects the other of said terminals of said second exciting coil to said power supply, so that said first and second exciting coils are excited in such a fashion as to mutually strengthen their magnetic fields when said switch is under a first state, and as to mutually offset their magnetic fields when said switch is under a second state.

24. An electron lens according to claim 23, which further comprises:
means for temporarily turning off said power supply when said switch is changed over.

25. An electron lens according to claim 18, which further comprises:
a third exciting coil;
and wherein said first and second exciting coils have substantially the same number of turns and the same turning direction, said third exciting coil has substantially the same number of turns as that of said first exciting coil but has a different turning direction from said first exciting coil, and said second and third exciting coils and connected in parallel with said first exciting coil, and said excitation control means always excites said first exciting coil and selectively excites one of said second and third exciting coils by a switch, so that said first and second exciting coils are excited in such a manner as to mutually strengthen their magnetic fields when said switch is under a first state, and said first and third exciting coils are excited in such a manner as to offset mutually and substantially their magnetic fields when said switch is under a second state.

26. An electron lens according to claim 18, wherein said first exciting coil and said second exciting coil have substantially the same number of turns, and said excitation control means selectively assumes a first state where said first and second exciting coils are excited in such a manner as to strengthen their magnetic fields, and a second state where said first and second exciting coils are excited in such a manner as to substantially offset their magnetic fields.

27. A method of turning off an electron lens while keeping a temperature of a casing substantially constant in said electron lens including first and second exciting coils having the same number of turns and the same turning direction, and said casing storing therein said first and second exciting coils, said casing having a magnetic path with a signal gap therein, comprising the steps of:
applying a first current to said first exciting coil; and
applying a second current having an opposite polarity to the polarity of said first current but having the same absolute value to said second exciting coil.

28. A method of turning on and off an electron lens while keeping a temperature of a casing substantially constant in said electron lens including first and second exciting coils having the same number of turns and the same turning direction, and said casing storing therein said first and second exciting coils, said casing having a magnetic path with a single gap therein, comprising the steps of:
applying a first current to said first exciting coil and applying a second current having an opposite polarity to the polarity of said first current but having the same absolute value to said second exciting coil, so as to turn off said electron lens; and
applying a first current to said first exciting coil and to said second exciting coil, so as to turn on said electron lens.

29. A method for controlling an electronic lens having a first exciting coil, a second exciting coil, a casing for encompassing the first and second exciting coils, first and second power supplies for supplying currents to the first and second exciting coils, respectfully, disposed outside the casing, and power supply lines for connecting the power supplies to the first and second exciting coils, penetrating through the case, the method comprising the steps of:
controlling and excitation state of at least the first exciting coil independently from the second exciting coil;
controlling a first quantity of the current supplied to at least the first exciting coil independently of a second quantity of the current supplied to the second exciting coil; and
maintaining the sum of an absolute value of the first current quantity and an absolute value of the second current quantity substantially constant.

* * * * *